(12) United States Patent
Castro et al.

(10) Patent No.: US 8,176,351 B2
(45) Date of Patent: May 8, 2012

(54) SAMPLING MECHANISM FOR DATA ACQUISITION COUNTERS

(75) Inventors: Rafael Castro, Round Rock, TX (US); Brian Keith Odom, Georgetown, TX (US)

(73) Assignee: National Instruments Corporation, Austin, TX (US)

( * ) Notice: Subject to any disclaimer, the term of this patent is extended or adjusted under 35 U.S.C. 154(b) by 1341 days.

(21) Appl. No.: 11/768,255

(22) Filed: Jun. 26, 2007

(65) Prior Publication Data

US 2008/0043826 A1 Feb. 21, 2008

Related U.S. Application Data

(60) Provisional application No. 60/823,035, filed on Aug. 21, 2006.

(51) Int. Cl.
*H04B 1/38* (2006.01)

(52) U.S. Cl. ........ 713/400; 713/401; 713/500; 713/501; 713/502; 713/503; 713/600; 713/601; 375/222; 375/223; 375/225; 327/156

(58) Field of Classification Search .......... 713/600–601, 713/500–503, 400–401; 375/222, 223, 225; 327/156
See application file for complete search history.

(56) References Cited

U.S. PATENT DOCUMENTS

| | | | |
|---|---|---|---|
| 4,757,264 A | 7/1988 | Lee et al. | |
| 4,940,948 A | 7/1990 | Laws et al. | |
| 5,532,632 A | 7/1996 | Kent | |
| 6,008,672 A * | 12/1999 | Suto | 327/34 |
| 6,313,777 B1 * | 11/2001 | Horvat et al. | 341/144 |
| 6,449,728 B1 | 9/2002 | Bailey | |
| 6,668,032 B1 | 12/2003 | Nayler | |
| 6,714,613 B2 | 3/2004 | Schenk | |
| 6,737,995 B2 | 5/2004 | Ng et al. | |
| 6,753,926 B1 | 6/2004 | Nishino | |
| 6,856,659 B1 | 2/2005 | Pierrick | |
| 7,006,415 B2 | 2/2006 | Hou et al. | |
| 7,093,052 B2 | 8/2006 | Cho et al. | |
| 7,133,480 B2 | 11/2006 | Colborne et al. | |
| 7,135,901 B2 | 11/2006 | Tsai | |
| 7,233,638 B2 | 6/2007 | Sumiyoshi | |
| 7,245,682 B2 | 7/2007 | Hsu et al. | |
| 7,259,606 B2 | 8/2007 | Ku et al. | |
| 7,260,493 B2 | 8/2007 | Laquai et al. | |
| 7,275,171 B2 | 9/2007 | Kizer et al. | |
| 7,342,984 B1 | 3/2008 | Yearsley et al. | |
| 7,349,509 B2 | 3/2008 | Ribo et al. | |
| 7,391,416 B2 | 6/2008 | Yearim | |

(Continued)

*Primary Examiner* — Abdelmoniem Elamin
(74) *Attorney, Agent, or Firm* — Meyertons Hood Kivlin Kowert & Goetzel, P.C.; Jeffrey C. Hood

(57) ABSTRACT

One or more counter units of a data acquisition device used to perform sampling operations. Each of the counter units is configurable to operate in a selected one of a plurality of modes. During operation, at least one of the counter units may receive a measurement signal (or input signal) acquired by the data acquisition device and also a sample clock signal. The counter unit may sample the measurement signal based on the selected operational mode and timing of the sample clock, and at a rate that is independent of the frequency of the measurement signal. Furthermore, the counter unit may sample the measurement signal based on a selected one of a plurality of timing modes associated with the sample clock signal. The counter units may take samples of the measurement signal to perform at least one of the following types of measurements: period, frequency, pulse-width, semi-period, time separation, or event counting.

21 Claims, 7 Drawing Sheets

U.S. PATENT DOCUMENTS

| | | | |
|---|---|---|---|
| 7,795,925 B2 * | 9/2010 | Marutani | 327/3 |
| 2003/0076251 A1 * | 4/2003 | Gupta et al. | 341/133 |
| 2004/0062329 A1 | 4/2004 | Hsu et al. | |
| 2004/0114679 A1 * | 6/2004 | Ryu et al. | 375/222 |
| 2004/0236977 A1 | 11/2004 | Kizer et al. | |
| 2006/0215776 A1 | 9/2006 | Wu et al. | |
| 2006/0247881 A1 | 11/2006 | Laquai et al. | |
| 2007/0195918 A1 | 8/2007 | Sumiyoshi | |
| 2007/0237276 A1 | 10/2007 | Tsai | |
| 2009/0267666 A1 * | 10/2009 | Marutani | 327/160 |

* cited by examiner

SAMPLING MECHANISM FOR DATA ACQUISITION COUNTERS

PRIORITY CLAIM

This application claims benefit of priority of U.S. provisional patent application No. 60/823,035 titled "Sample Clock for Data Acquisition Counters" filed on Aug. 21, 2006 whose inventors were Rafael Castro and Brian Keith Odom, and which is hereby incorporated by reference as though fully and completely set forth herein.

BACKGROUND OF THE INVENTION

1. Field of the Invention

This invention relates to measurement and data acquisition systems and, more particularly, to an improved sampling mechanism.

2. Description of the Related Art

Data acquisition boards may include counters used to perform several kinds of measurements. Some examples of these measurements are: pulse-width measurements; frequency and period measurements; event counting measurements; position measurements; etc. Typically, there are two modes of operation for a counter when making any of these measurements. The counter may operate in single point mode, in which (after being enabled) the counter performs a single measurement and then disables itself. Alternatively, the counter may operate in a "buffered" mode, in which the counter acquires many measurements and then may be manually disabled by the user.

In single point mode of operation, the counter may require some setup time in order to start every measurement. This overhead limits the rate at which these measurements can be taken. Also, the start of the measurement may be determined by a software command, so it is usually difficult to synchronize with other measurements. In this mode, the data transfer is relatively slow since setting up faster mechanisms is not efficient for a single point transfer.

In the buffered mode of operation, when making time related measurements, the counter may perform every measurement in a row as dictated by the input signal and the type of measurement. For example, if period measurements are performed, the counter measures every period of the input signal and generates one sample or measurement for every period of the signal. A consequence of this is that the data rate of the measurement may be dependent on the frequency of the signal to be measured.

The single point and buffered modes of operation are not ideal for several applications. For instance, in control applications, several measurements are obtained and typically these measurements are part of a tight software control loop. It is beneficial for the control loop to run as fast as possible. In control applications, the single point mode is not a good option due to the extra overhead it puts on the processor of the system. Also, the control loop may be significantly slowed down because of the slow nature of the data transfer in single point mode. Buffered mode may also not be a good fit for control applications, since the control loop usually requires data at a rate matching that of the control loop, not that of the input signal. For example, if a control loop needs to monitor a signal that has a frequency of 1 Mhz, in buffered mode this would require the control loop to run at such a high rate. Discarding data either at the data acquisition hardware or at the host computer is a cumbersome solution that slows down performance of the system.

Furthermore, neither the single point mode nor the buffered mode is a good option in the following situations: (1) When a signal needs to be monitored or measured and its frequency is higher than the desired sample rate; (2) When the data generation of sampling the signal and generating data for every period exceeds the bandwidth available in the communications channel of the data acquisition device; and (3) When the latency of the measurement is a critical parameter; etc.

Many other problems and disadvantages of the prior art will become apparent to one skilled in the art after comparing such prior art with the present invention as described herein.

SUMMARY OF THE INVENTION

Various embodiments are disclosed of one or more counter units included in a data acquisition device for performing sampling operations. Each of the counter units is configurable to operate in a selected one of a plurality of modes. During operation, at least one of the counter units may receive a measurement signal (or input signal) acquired by the data acquisition device and also a sample clock signal. The counter unit may sample the measurement signal based on the selected operational mode and timing of the sample clock, and at a rate that is independent of the frequency of the measurement signal. Furthermore, the counter unit may sample the measurement signal based on a selected one of a plurality of timing modes associated with the sample clock signal.

The counter units may be configurable to operate in one of the following modes: a single sample operational mode, a double sample operational mode, an auxiliary operational mode, or default operational mode. The counter units may be further configurable to sample the measurement signal based on a selected one of the following timing modes associated with the sample clock signal: a first timing mode, a second timing mode, a third timing mode, or a fourth timing mode.

The counter units may take samples of a measurement signal to perform at least one of the following types of measurements: period, frequency, pulse-width, semi-period, time separation, or event counting. Each of the counter units may perform sampling operations independent from the other counter units. Additionally, each of the counter units may include a main counter and an auxiliary counter.

Figure 1:
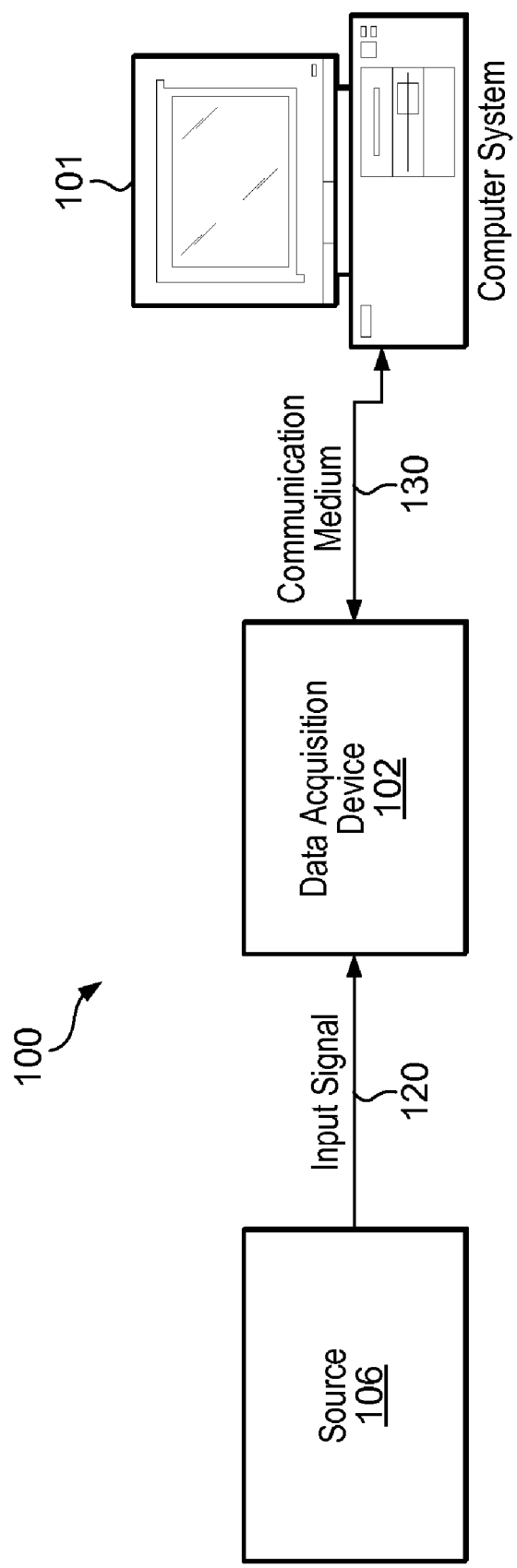
FIG. 1 is a diagram of one embodiment of a computer-based measurement system or data acquisition system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

FIG. 1 is a diagram of one embodiment of a computer-based measurement system or data acquisition system 100. The data acquisition system 100 may comprise a computer system 101, a measurement device referred to as a data acquisition (DAQ) device 102, and source device 106. As illustrated in FIG. 1, in one embodiment, the computer system 101 may be coupled to the DAQ device 102 via a communication medium 130. The DAQ device 102 may be an internal card or board coupled to a bus, e.g., a Peripheral Component Interconnect (PCI), PCI Express, Industry Standard Architecture (ISA), or Extended Industry Standard Architecture (EISA) bus, but is shown external to the computer 101 for illustrative purposes. The measurement device or DAQ device 102 may also be an external device coupled to the computer system 101. In this embodiment, the communication medium 130 may be a serial bus, such as USB, IEEE 1394, MXI bus, Ethernet, or a proprietary bus, or a parallel bus such as GPIB or others. It is noted that the communication medium 130 may be a wired or wireless communication medium.

The DAQ device 102 may be coupled to an external source 106, such as an instrument, sensor, transducer, or actuator from which the DAQ device 102 may receive an input signal 120, e.g., an analog input such as sensor data. In one example, the external source 106 may be a temperature sensor included in a unit under test (UUT). In this example, the DAQ device 102 may receive temperature reading from the temperature sensor and convert the analog data to digital form to be sent to the computer system 101 for analysis. Additionally, the DAQ device 102 may receive a digital input, e.g., a binary pattern, from the external source 106. Furthermore, the DAQ device 102 may also produce analog or digital signals, e.g., for stimulating the UUT. It is noted, however, that in some embodiments, the DAQ device 102 may be connected to source device 106 (e.g., a sensor or other component) that is internal to the computer system 101 and/or the DAQ device 102.

The computer system 101 may control the operations of the DAQ device 102. For example, the computer system 101 may direct the DAQ device 102 to perform an acquisition, and may obtain data from the DAQ device 102 for storage and analysis therein. Additionally, the computer system 101 may send data to the device 102 for various purposes, such as for use in generating analog signals used for stimulating a UUT.

The computer system 101 may include a processor, which may be any of various types, including an x86 processor, e.g., a Pentium™ class, a PowerPC™ processor, a CPU from the SPARC™ family of RISC processors, as well as others. Also, the computer system 101 may also include one or more memory subsystems (e.g., Dynamic Random Access Memory (DRAM) devices). The memory subsystems may collectively form the main memory of computer system 101 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program the DAQ device 102 accordingly.

Figure 2A:
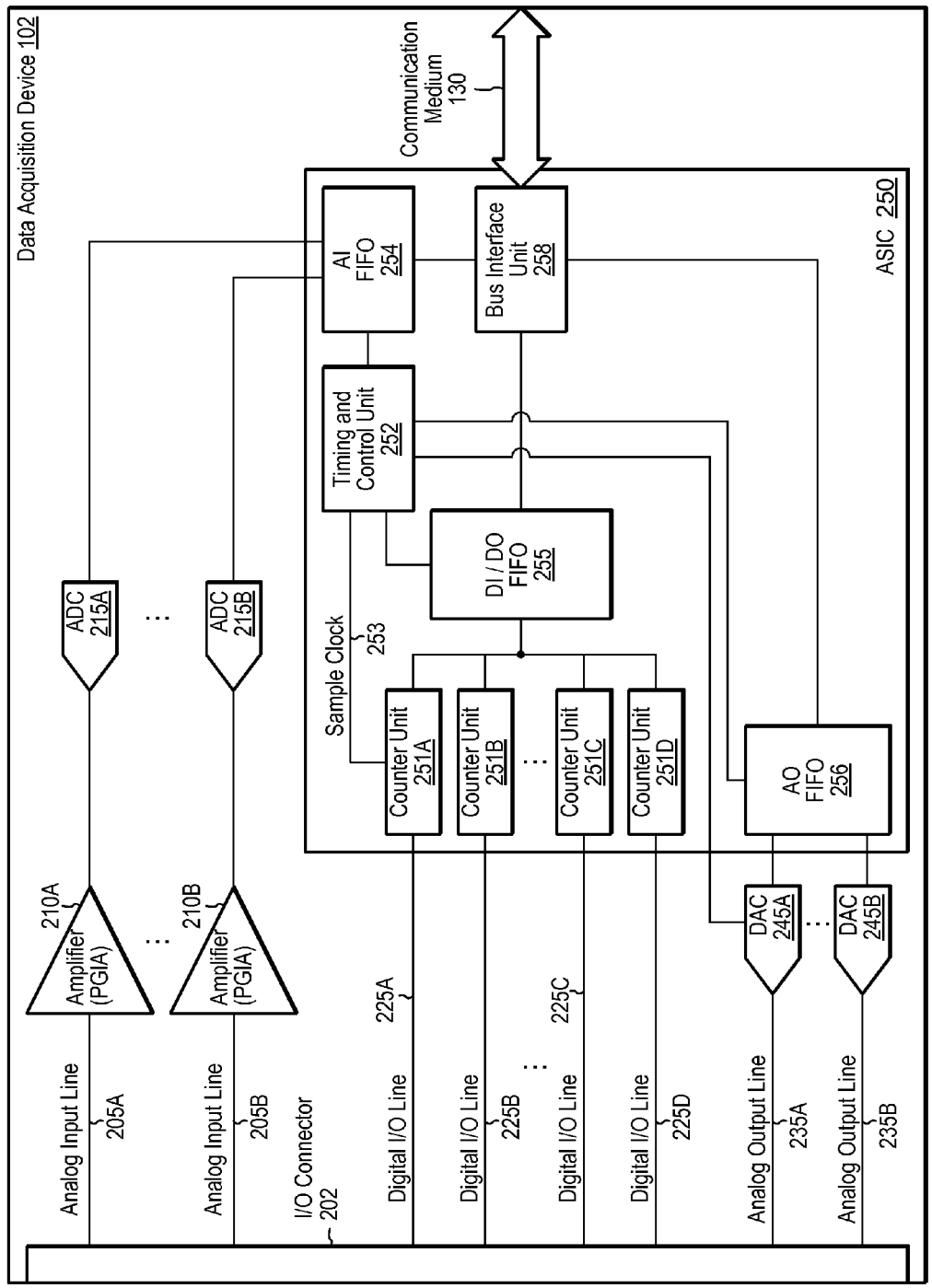
FIG. 2A is a block diagram of one embodiment of a data acquisition (DAQ) device.

FIG. 2A is a block diagram of one embodiment of a data acquisition (DAQ) device 102. Components that correspond to those shown in FIG. 1 are numbered identically for simplicity and clarity. As described above, the DAQ device 102 may be an internal device coupled to, e.g., a PCI bus, or may also be an external device coupled to the computer system 101 via a serial bus, e.g., MXI bus, or a parallel bus, e.g., a GPIB. The DAQ device 102 may be a board or a module comprising one or more integrated circuits (ICs) or the DAQ device 102 may be an IC, for example, a mixed-signal IC.

The DAQ device 102 may comprise an input/output (I/O) connector 202, analog input lines 205A and 205B, instrumentation amplifiers 210A and 210B, analog-to-digital converters (ADCs) 215A and 215B, digital I/O lines 225A, 225B, 225C, and 225D, analog output lines 235A and 235B, a timing and data control IC (e.g., application-specific integrated circuit (ASIC) 250), digital-to-analog converters (DACs) 245A and 245B, and communication medium 130. It should be noted that the components described with reference to FIG. 2A are meant to be exemplary only, and are not intended to limit the invention to any specific set of components or configurations. For example, in various embodiments, one or more of the components described may be omitted, combined, modified, or additional components included, as desired. For instance, in one embodiment, DAQ device 102 may include the digital I/O lines, but not the analog I/O lines.

The DAQ device 102 may receive and send digital and/or analog data via the input and output lines of the I/O connector 202. For example, the I/O connector 202 may be coupled to a signal source (e.g., source 106 of FIG. 1) included in a UUT to receive digital and/or analog signals. The I/O connector 202 may include analog input lines 205A and 205B, which may convey received analog signals to instrumentation amplifiers 210A and 210B. In one embodiment, the instrumentation amplifiers 210A and 210B may be configured as programmable gain instrumentation amplifiers (PGIAs). The output of instrumentation amplifier 210A may be connected to ADC 215A, which may digitize the analog signals and provide the digitized signals to ASIC 250. The I/O connector 202 may also include digital I/O lines 225A-225D, which may provide received digital signals to ASIC 250 for further processing. It is noted that in other embodiments the data acquisition device 102 may comprise any number of digital I/O lines, analog I/O lines, amplifiers and ADC's, e.g., two digital I/O lines, four analog I/O lines, four PGIAs and four ADCs.

In one embodiment, ASIC 250 may be a mixed-signal ASIC that performs timing and data control functions for the DAQ device 102. It is noted, however, that in other embodiments other types of timing and data control ICs may be used. ASIC 250 may include a plurality of counter units 251A-251D, a timing and control unit 252, an analog input (AI) first-in first-out (FIFO) buffer 254, a digital input (DI)/digital output (DO) FIFO buffer 255, an analog output (AO) FIFO buffer 256, and a bus interface unit 258. It is noted that in other embodiments one or more of the components described may be omitted, combined, modified, or additional components included, as desired.

The counter units 251A-251D may be used in DAQ device 102 to perform several kinds of measurements. Specifically, in response to receiving configuration information and a sample clock signal 253, one or more of the counter units 251 may take samples of at least one measurement signal acquired by DAC device 102 based on a selected operational mode and timing of the sample clock signal. Furthermore, the counter unit 251 may sample the measurement signal at a rate that is independent of the frequency of the measurement signal. The operational details of the counter units 251 will be further described below with reference to FIGS. 3A-3D and FIG. 4.

The acquired data may either be stored in the DI/DO FIFO buffer 255 or the AI FIFO buffer 254, depending on the input path of the data. In some embodiments, data that is sampled by the counter units 251 may be stored in a FIFO buffer included within the corresponding counter unit 251 (see FIG. 2B). The stored data is subsequently sent to the bus interface unit 258. In one embodiment, the bus interface unit 258 may be coupled to the communication medium 130 for sending data to and receiving data from a computer system (e.g., computer system 101 of FIG. 1). The bus interface unit 258 may be operable to implement the protocol associated with the type of bus coupled to the DAQ device 102. As described above, exemplary buses coupled to the bus interface unit 258 include a PCI, PCI Express, USB, IEEE 1394, PXI bus, or Ethernet, among others. In one embodiment, the bus interface unit 258 may send the data to the computer system 101 for storage and analysis of the data.

As described above, the computer system (e.g., computer system 101 of FIG. 1) may provide digital signals to the DAQ device 102 to stimulate a UUT. In one embodiment, the digital signals may need to be converted to analog form to stimulate the UUT. Therefore, in this embodiment, after the ASIC 250 of DAQ device 102 receives the digital signals and stores them in AO FIFO buffer 256, the digital data may be transmitted to DAC 245A to be converted to analog form. The analog signals may then be sent to the I/O connector 202 via the analog output line 235A. It is noted that the DAQ device 102 may comprise any number of DACs, for example, other embodiments may include a single DAC or four DACs.

Figure 2B:
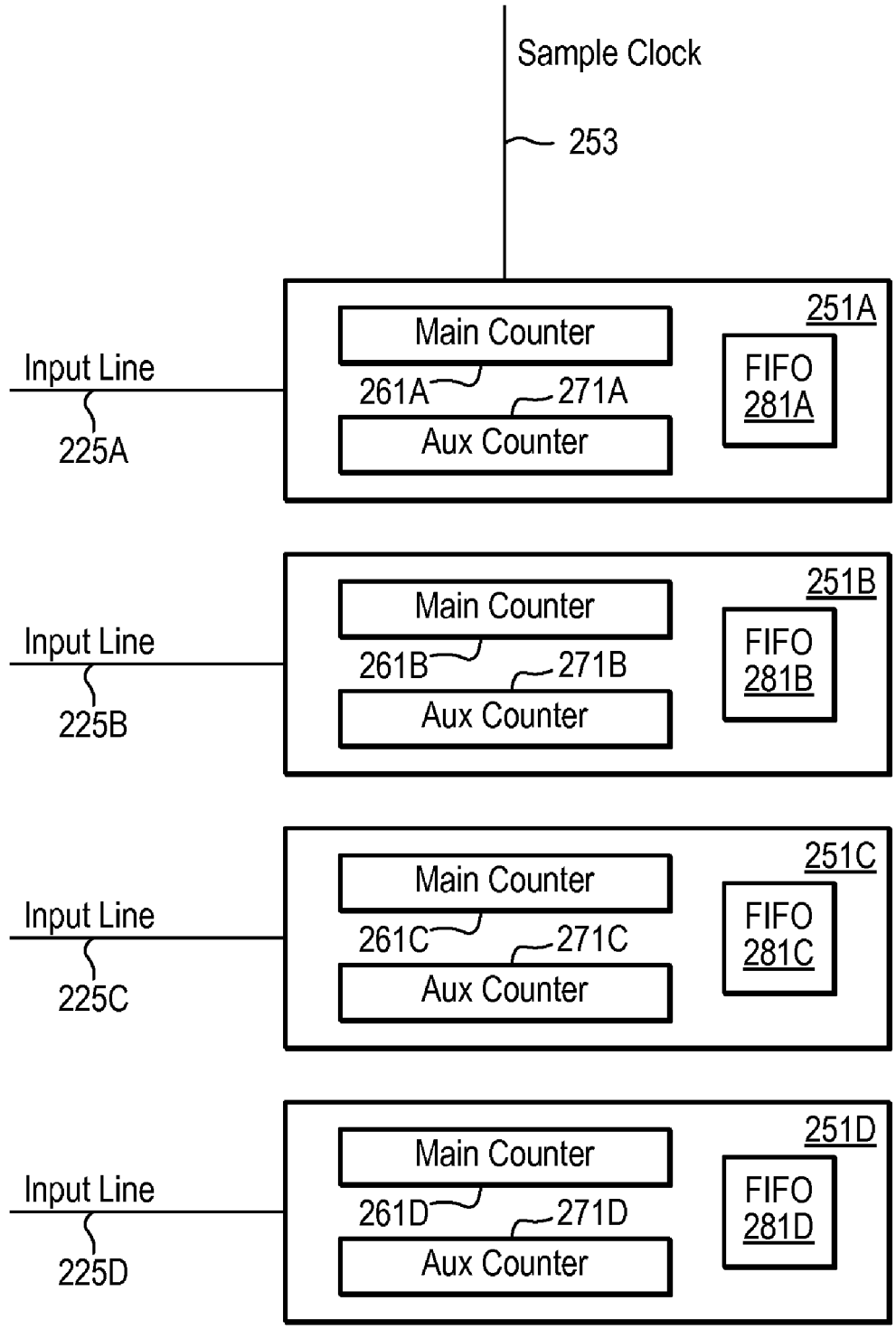
FIG. 2B is a block diagram of one embodiment of counter units included within the DAQ device of FIG. 2A.

In various embodiments, as illustrated in FIG. 2B, the counter units 251A-251D may include main counters 261A-261D, auxiliary counters 271A-271D, and FIFO buffers 281A-281D. The main counter 261 and auxiliary counter 271 may be used at the same time to perform certain sampling operations when the counter unit is an auxiliary operational mode, as will be described further below with reference to FIG. 3C. In one embodiment, the FIFO buffer 281 within each counter unit 251 may replace the DI/DO FIFO buffer 255 shown in FIG. 2A. In other embodiments, the DAQ device 102 may include both the DI/DO FIFO buffer 255 and the FIFO buffers 281. It is noted that in other embodiments one or more of the components described may be omitted, combined, modified, or additional components included, as desired.

FIGS. 3A-3D are diagrams illustrating the various operational modes and timing modes implemented by each of the counter units 251 of DAQ device 102, according to one embodiment. As described above, one or more of the counter units 251 are configurable to sample a measurement signal (i.e., an input signal) acquired by DAQ device 102 based on the selected operational mode and timing of the sample clock signal 253, and at a rate that is independent of the frequency of the measurement signal. In other words, this technique allows the decoupling of the frequency of the measurement from the frequency of the sampling. Furthermore, it is noted that in any of the operational modes described below, each of the counter units 251 may independently perform sampling operations, and the DAQ device 102 may utilize one or more of the counter units 251 at any given point in time depending on the sampling requirements of the system.

Figure 3A:
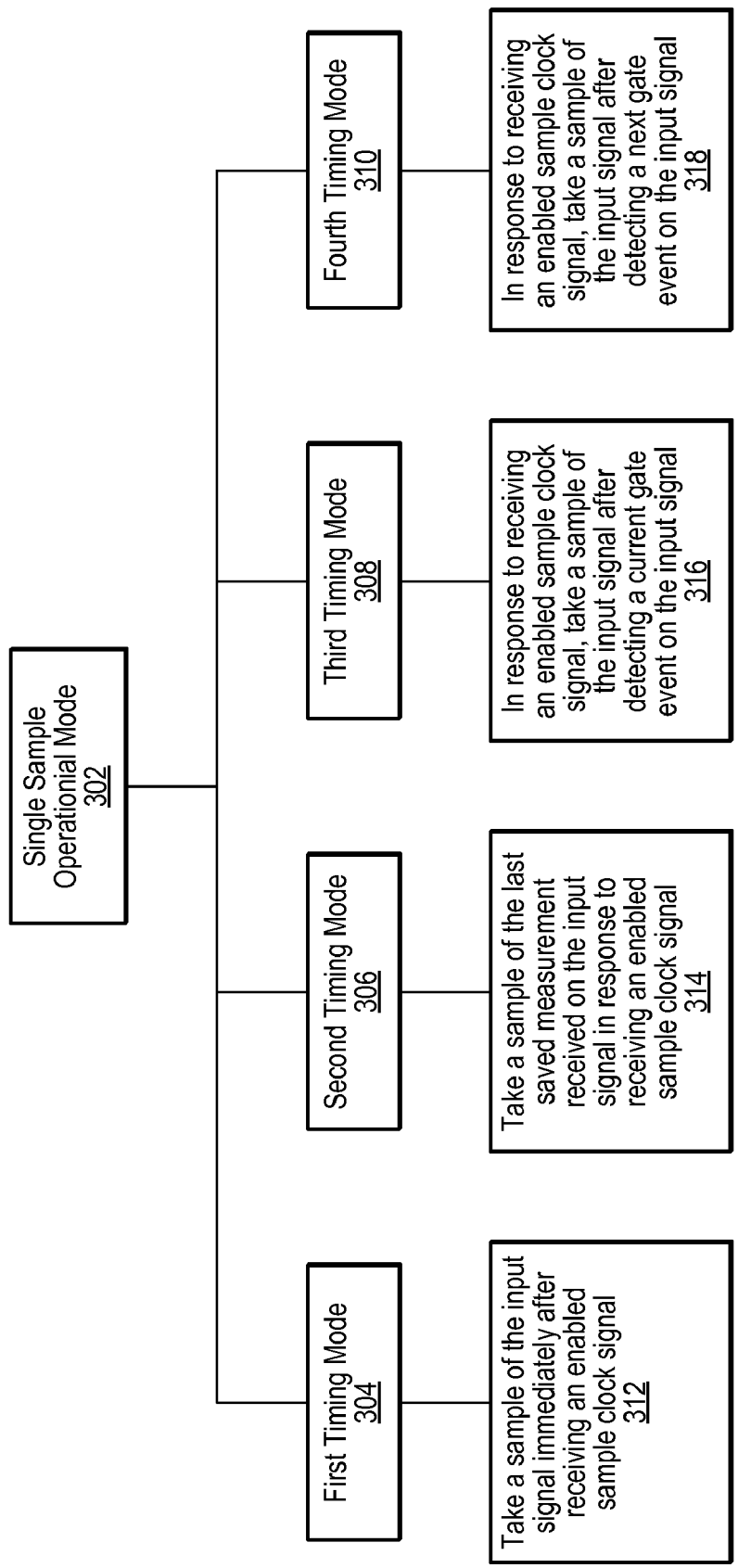
FIG. 3A illustrates a single sample operational mode and the corresponding timing modes that are associated with the sample clock signal, according to one embodiment.

FIG. 3A illustrates the single sample operational mode 302 and the corresponding timing modes that are associated with the sample clock signal 253, according to one embodiment. In the single sample mode 302, a counter unit 251 (e.g., counter unit 251A) may sample an acquired measurement signal (or input signal) once each time the counter unit 251 receives an enabled sample clock signal. The single sample mode 302 may be used to perform various types of measurements, such as period measurements, pulse-width measurements, and event counting measurements, among others. The timing of the sampling operation may be dependent on the programmed timing mode associated with the sample clock signal. As shown in FIG. 3A, in the single sample operational mode, one or more of counter units 251 may be configured to implement a first, second, third, or fourth timing mode.

When the single sample operational mode 302 and the first timing mode 304 are selected, the counter unit 251 may take a single sample of the input signal immediately after receiving an enabled sample clock signal (block 312). In this mode, the counter unit 251 may save data solely based on the sample clock signal events. This mode is useful for cases that previously required detecting gate events on the input signal for the saving operation, such as event counting or position measurement. Not using the gate may have several advantages, for instance: (1) consistency of programming between operation, since the sample clock may be used on any type of operation; (2) allows gated event counting in which the saving of data is not related to the gating itself, and (3) allows the use of the main counter 261 of the counter unit 251 for one operation that does not use the gate (such as event counting or position measurement), and the auxiliary counter 271 of the counter unit 251 for event counting on the gate at the same time.

As will be described further below, the second, third, and fourth timing modes save data based on both the sample clock and the gate events detected on the input signal. This is useful for operations in which the gate determines the measurement, such as in period, pulse-width, semi-period, or frequency measurements. The counter unit 251 may be free running, performing the selected measurement on the background. When an enabled sample clock signal is detected, the counter may wait for the appropriate gate event(s) to sample and save the corresponding data.

In some embodiments, the counter unit 251 may temporarily store the last one or more measurements received on the input signal in a local memory or buffer. When subsequent measurements are received, the counter unit 251 discards the previously stored measurements and temporarily stores the most recent measurements. Therefore, in these embodiments, the counter unit 251 continuously discards old measurements and temporarily stores new measurements.

When the single sample operational mode 302 and the second timing mode 306 (or "save last" mode) are selected, the counter unit 251 may take a single sample of the last saved measurement received on the input signal in response to receiving an enabled sample clock signal (block 314). For instance, with reference to the timing diagram of FIG. 4, the measurement and gate event corresponding to time period "A" may be the last saved measurement. When an enabled sample clock signal is subsequently detected, the counter unit

251 may take a sample of last saved measurement. In this mode, the goal is to minimize the latency from the time the sample clock is enabled to the time the data is returned. When an enabled sample clock is detected, the counter unit 251 may take a sample of the latest measurement that was temporarily stored in the local memory and immediately return it.

In one embodiment, the counter unit 251 temporarily stores the last one or more measurements received on the input signal only when it is programmed to implement the second timing mode. It is noted, however, that in other embodiments the counter unit 251 may perform the store operation when implementing some or all of the timing modes.

When the single sample operational mode 302 and the third timing mode 308 (or "save current" mode) are selected, in response to receiving an enabled sample clock signal, the counter unit 251 may take a sample of the input signal after detecting a current gate event on the input signal (block 316). For instance, with reference to the timing diagram of FIG. 4, the measurement and gate event corresponding to time period "B" may be the current gate event. In other words, in this mode, the counter unit 251 may sample the first measurement to complete after an enabled sample clock signal is detected and then save the sampled data.

When the single sample operational mode 302 and the fourth timing mode 310 (or "save next" mode) are selected, in response to receiving an enabled sample clock signal, the counter unit 251 may ignore the current gate event on the input signal and instead wait to take a sample after detecting a next gate event on the input signal (block 318). For instance, with reference to the timing diagram of FIG. 4, the measurement and gate event corresponding to time period "C" may be the next gate event. In this mode, the counter unit 251 may start a new measurement after an enabled sample clock signal is detected and then save the resulting data from that measurement.

Figure 3B:
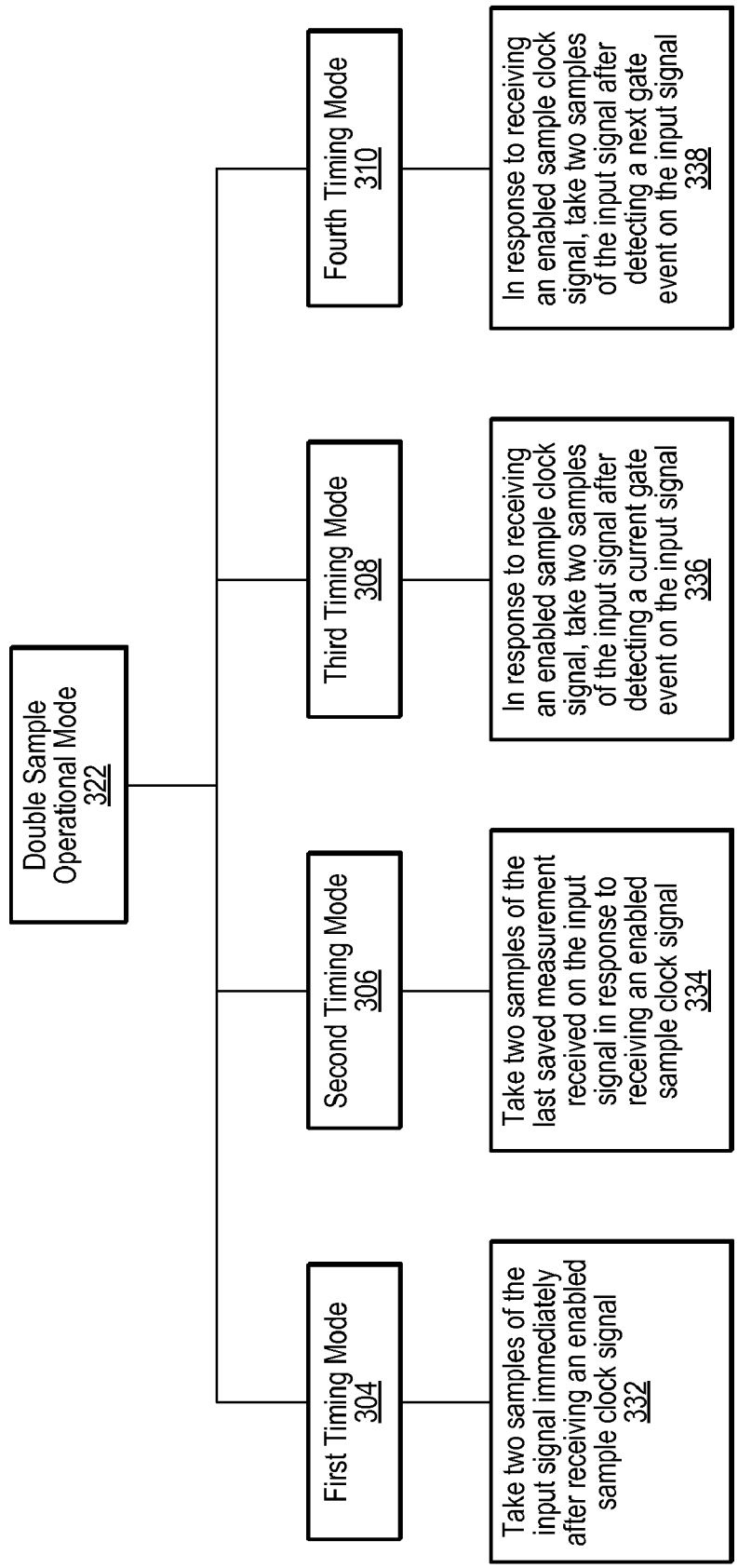
FIG. 3B illustrates a double sample operational mode and the corresponding timing modes that are associated with the sample clock signal, according to one embodiment.

FIG. 3B illustrates a double sample operational mode 322 and the corresponding timing modes that are associated with the sample clock signal 253, according to one embodiment. In the double sample mode 322, a counter unit 251 (e.g., counter unit 251A) samples an acquired measurement signal (or input signal) twice each time the counter unit 251 receives an enabled sample clock signal. The double sample mode 322 may be useful to perform certain measurements, such as semi-period measurements, in order to acquire both semi-periods and calculate the duty cycle of the signal, for example. The timing of the sampling operation may be dependent on the programmed timing mode associated with the sample clock signal. As shown in FIG. 3B, similar to the single sample operational mode 302, in the double sample operational mode, one or more of the counter units 251 may be configured to implement a first, second, third, or fourth timing mode.

When the double sample operational mode 302 and the first timing mode 304 are selected, the counter unit 251 may take two samples of the input signal immediately after receiving an enabled sample clock signal (block 332). In this mode, the counter unit 251 may save data solely based on the sample clock signal events.

As noted above, in some embodiments, during operation one or more measurements are saved in a local memory or buffer of the counter unit 251. When the double operational mode 322 and the second timing mode 306 (or "save last" mode) are selected, the counter unit 251 may take two samples of the last saved measurement received on the input signal in response to receiving an enabled sample clock signal (block 334). In one example, the counter unit 251 may temporarily store the last one or more measurements received on the input signal, e.g., F0, R0, F1, R1, F2, R2, which correspond to the falling and rising edges of the measurement or input signal (i.e., the corresponding gate events). When the enabled sample clock signal is detected, the counter unit 251 may take two samples of the last saved measurement, which in the previous example may be F2, R2.

When the double sample operational mode 322 and the third timing mode 308 (or "save current" mode) are selected, in response to receiving an enabled sample clock signal, the counter unit 251 may take two samples of the input signal after detecting a current gate event on the input signal (block 336). In other words, in this mode, the counter unit 251 may take two samples of the first measurement to complete after an enabled sample clock signal is detected and then save the sampled data.

When the double sample operational mode 322 and the fourth timing mode 310 (or "save next" mode) are selected, in response to receiving an enabled sample clock signal, the counter unit 251 may ignore the current gate event on the input signal and instead wait to take two samples of the input signal after detecting a next gate event on the input signal (block 338). In this mode, the counter unit 251 may start a new measurement after an enabled sample clock signal is detected and then take two samples of the measurement.

Figure 3C:
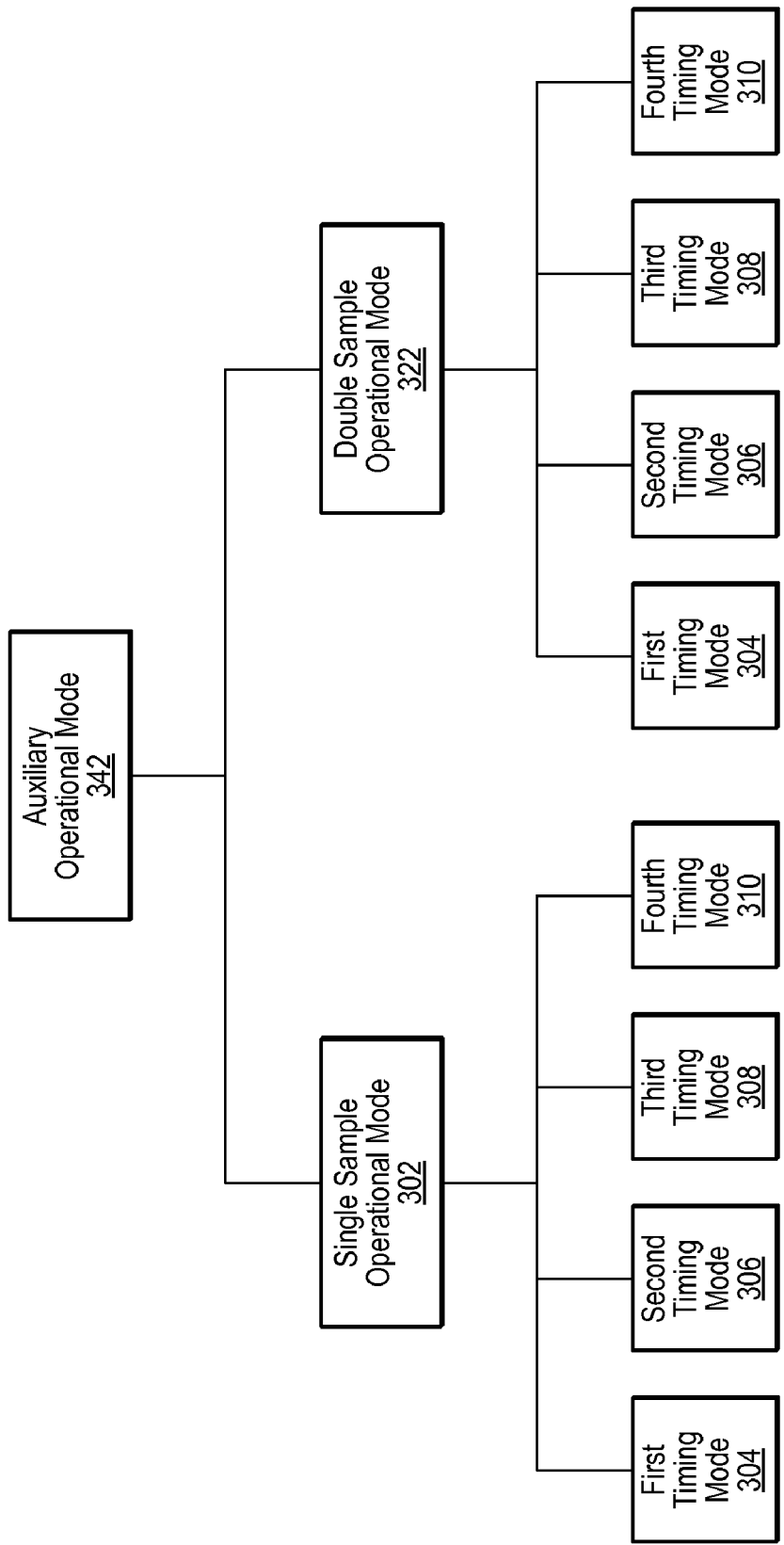
FIG. 3C illustrates an auxiliary sample operational mode, according to one embodiment.

FIG. 3C illustrates an auxiliary sample operational mode 342, according to one embodiment. In this mode, the main counter 261 and the auxiliary counter 271 may be configured to operate in either the single sample mode 302 or the double sample mode 322, and in one of the timing modes 304, 306, 308, and 310, which were described above with reference to FIGS. 3A and 3B. The auxiliary counter 271 may be used to assist the main counter 261 in doing certain measurements or operations that in typical systems normally require the use of two "user" counters. One advantage of the auxiliary counter 271 is that the auxiliary counter is much smaller than the main counter 261, since it may only need to perform a limited number of operations. Another advantage is that because this is an internal counter to the counter unit 251, a much tighter integration can be achieved. The auxiliary mode and auxiliary counter may be used in various operations, such as frequency measurement (e.g., the reciprocal method), finite pulse train generation, and parallel event counting, among others. For example, to perform a frequency measurement, during a sample clock period, one of the counters may count the number of periods of the input signal and the other counter may count the number of periods of a known timing signal (a time base). Then, the frequency of the input signal may be calculated based on the known frequency of the known timing signal and the collected period data.

In the auxiliary operational mode 342, if the counter unit 251 is programmed to implement the first timing mode, an enabled sample clock signal causes the data from both the main counter 261 and the auxiliary counter 271 to be saved immediately. This may be useful when performing parallel event counting, since the sample clock directs the counter unit 251 to take an immediate snapshot of the state of both the main and auxiliary counters. If the counter unit 251 is programmed to implement the second, third, or fourth timing modes, an enabled sample clock signal causes the counters to take one or more samples when a gate event(s) is detected on the input signal. This may be useful in frequency measurement applications, in which the sample clock notifies that the user wants a measurement and the counter waits for the input signal to have a gate event before saving the data on both counters.

Figure 3D:
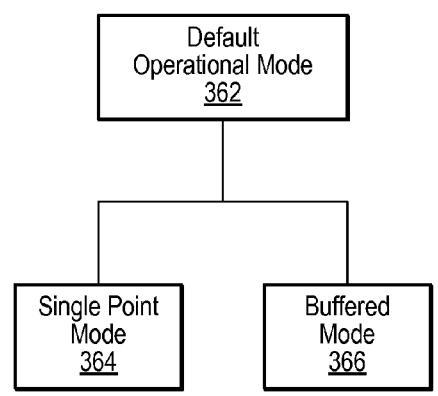
FIG. 3D illustrates a default operational mode, according to one embodiment.
Figure 4:
FIG. 4 illustrates a timing diagram including a sample clock signal and a measurement signal, according to one embodiment.

FIG. 3D illustrates a default operational mode 362, according to one embodiment. In this mode, the counter unit 251 may be configured to operate in either the single point mode 364 or the buffered mode 366.

During operation, one or more of the counter units 251 may be programmed to operate in a specific mode by a configuration signal provided by the user of the DAQ device 102 or by a system that controls the operation of the DAQ device 102. For instance, the user may select the single sample operational mode and the third timing mode using the computer system 101. In response to the selection, the computer system 101 may provide a configuration signal to one or more of the counter units 251 of DAQ device 102 for configuration purposes. It is noted, however, that in other implementations the counter units 251 may be programmed by other methods, e.g., the user may run a software program on computer system 101 that automatically programs the counter units 251 at various times for a predetermined amount of time or until the DAQ device 102 acquires a certain amount of data.

In one embodiment, the sample clock signal 253 may be provided to the counter units 251 from a source internal or external to the DAQ device 102. For instance, the timing and control unit 252 may internally generate the sample clock signal 253. Alternatively, sample clock signal 253 may be provided to the counter units 251 from the computer system 101 via the bus interface unit 258 or from other external sources, e.g., via analog or digital input channels.

In various embodiments, the counter units 251 may include an error detection mechanism for overrun. Overrun of the sample clock signal 253 may be defined as an error condition in which the counter unit 251 cannot return data because of the timing of the sample clock signal. This could be caused either because the sample clock happened too fast (faster than the actual measurement), or because the sample clock occurred before the measurement was ready.

For instance, when the counter unit 251 is configured in the third timing mode (or the "save current" mode), an overrun may occur if a sample clock has already been detected and the counter unit 251 is waiting for the measurement to complete before saving the data, and then another sample clock is detected. In case of an overrun in this mode, in one implementation, to prevent an error the second sample clock will be ignored and will not generate any data. Also, if an overrun occurs, the counter unit 251 may be optionally programmed to not return any more data after an overrun is detected.

In another example, in the second timing mode (or the "save last" mode) an overrun may happen in the following two cases. The first case is if an enabled sample clock received before the counter unit 251 has actually completed the minimum number of measurements. That is, there is no data saved in the local buffer or memory that is available to be returned when the sample clock is detected. The second case is when a sample clock has been detected and data has been saved, and another sample clock is detected before the measurements have been updated. In this case, the counter unit 251 is basically asked to return the same measurement twice. In one implementation, the counter unit 251 may return data even if an overrun occurs. However, the counter unit 251 may be optionally programmed to not return any more data after an overrun is detected.

In one embodiment, an alternative version of the overrun mechanism is available that qualifies each sample that is taken by the counter unit 251. In one specific implementation, when this feature is enabled, the counter unit may insert additional bits (e.g., a 32-bit word) after each measurement to indicate the overrun status associated with the measurement. For example, one or more of the additional bits (e.g., the most significant bit) may indicate that the sample being returned is invalid due to an overrun error. The overrun status bits may be sent immediately after each sample on the data stream.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data acquisition device comprising:
   one or more input terminals;
   a counter unit coupled to the one or more input terminals, wherein the counter unit is configurable to operate in a selected one of a plurality of sampling modes;
   wherein the counter unit is configured to receive an input signal and a sample clock signal;
   wherein the counter unit is configured to sample the input signal based on the selected sampling mode and a timing of the sample clock signal, and at a rate that is independent of the frequency of the input signal;
   wherein the timing of the sample clock signal represents a point in time when the counter unit receives an enabled sample clock signal.

2. The data acquisition device of claim 1, wherein one of the operational modes is a single sample mode, wherein in the single sample mode the counter unit is configured to sample the input signal once each time the counter unit receives an enabled sample clock signal.

3. The data acquisition device of claim 1, wherein one of the operational modes is a double sample mode, wherein in the double sample mode the counter unit is configured to take two samples of the input signal each time the counter unit receives an enabled sample clock signal.

4. The data acquisition device of claim 1, wherein one of the operational modes is an auxiliary sample mode, wherein the counter unit includes a main counter and an auxiliary counter and is configured to receive one or more input signals, wherein in the auxiliary sample mode each time the counter unit receives an enabled sample clock signal both the main counter and the auxiliary counter are configured to sample the one or more input signals.

5. The data acquisition device of claim 1, wherein, in each of the plurality of operational modes, the counter unit is further configurable to sample the input signal based on a selected one of a plurality of timing modes associated with the sample clock signal.

6. The data acquisition device of claim 5, wherein, in a first timing mode, the counter unit is configured to take at least one sample of the input signal immediately after receiving an enabled sample clock signal.

7. The data acquisition device of claim 5, wherein the counter unit is configured to save the last one or more measurements received on the input signal, wherein, in a second timing mode, the counter unit is configured to take at least one sample of the last saved measurement in response to receiving an enabled sample clock signal.

8. The data acquisition device of claim 5, wherein, in a third timing mode, in response to receiving an enabled sample clock signal, the counter unit is configured to take at least one sample of the first measurement to complete on the input signal.

9. The data acquisition device of claim 5, wherein in a fourth timing mode, in response to receiving an enabled sample clock signal, the counter unit is configured to wait for the start of a new measurement on the input signal, wherein the counter unit is further configured to take at least one sample of the input signal after detecting the completion of the new measurement on the input signal.

10. The data acquisition device of claim 4, wherein, in the auxiliary sample mode, the main counter and auxiliary counter of the counter unit are configurable to operate in either a single sample operational mode or a double sample operational mode.

11. The data acquisition device of claim 1, wherein the counter unit is configured to take samples of the input signal to perform at least one of the following types of measurements: period, frequency, pulse-width, semi-period, time separation, or event counting.

12. The data acquisition device of claim 1, wherein the counter unit includes a main counter and an auxiliary counter.

13. The data acquisition device of claim 1, comprising a plurality of counter units, each configured to independently perform sampling operations.

14. The data acquisition device of claim 1, coupled to a device under test (DUT) via the one or more input terminals and to a host computer via one or more output terminals, wherein the data acquisition device is configured to receive the input signal from the DUT and, after sampling the input signal, the data acquisition device is configured to send the sampled data to the host computer.

15. The data acquisition device of claim 1, wherein the counter unit includes an overrun detection mechanism, wherein the overrun detection mechanism is configured to generate extra bits to indicate an overrun status for each of the samples taken by the counter unit.

16. A method for performing sampling operations in a data acquisition device, the method comprising:
    receiving a configuration signal for configuring a counter unit of the data acquisition device to operate in a selected one of a plurality of sampling modes;
    receiving an input signal and an enabled sample clock signal;
    sampling the input signal based on the selected sampling mode and a timing of the sample clock, and at a rate that is independent of the frequency of the input signal;
    wherein the timing of the sample clock represents a point in time when said receiving the enabled sample clock signal occurs.

17. The method of claim 16, wherein said selected operational mode includes one of the following:
    a single sample operational mode, wherein said sampling the input signal in the single sample mode includes sampling the input signal once each time the counter unit receives an enabled sample clock signal;
    a double sample operational mode, wherein said sampling the input signal in the double sample mode includes taking two samples of the input signal each time the counter unit receives an enabled sample clock signal;
    an auxiliary sample mode, wherein said sampling in the auxiliary sample mode includes sampling one or more input signals using both a main counter and an auxiliary counter of the counter unit each time the counter unit receives an enabled sample clock signal.

18. The method of claim 16, wherein said configuring a counter unit of the data acquisition device to operate in a selected one of a plurality of modes includes configuring the counter unit to implement a selected one of a plurality of operational modes and a selected one of a plurality of timing modes associated with the sample clock signal, wherein said selected one of a plurality of timing modes includes one of:
    a first timing mode, wherein said sampling the input signal in the first timing mode includes taking at least one sample of the input signal immediately after receiving an enabled sample clock signal;
    a second timing mode, wherein said sampling the input signal in the second timing mode includes taking at least one sample of the last saved measurement in response to receiving an enabled sample clock signal;
    a third timing mode, wherein said sampling the input signal in the third timing mode includes, after receiving an enabled sample clock signal, taking at least one sample of the first measurement to complete on the input signal;
    a fourth configuration, wherein said sampling the input signal in the fourth timing mode includes, after receiving an enabled sample clock signal, waiting for the start of a new measurement on the input signal, and taking at least one sample of the input signal after detecting the completion of the new measurement on the input signal.

19. The method of claim 16, further comprising taking samples of the input signal to perform at least one of the following types of measurements: period, frequency, pulse-width, semi-period, time separation, or event counting.

20. A data acquisition device comprising:
    a plurality of input terminals;
    a plurality of counter units, wherein each counter unit of the plurality of counter units is coupled to one or more of the plurality of input terminals, and wherein each counter unit includes a main counter and an auxiliary counter;
    wherein at least one of the plurality of counter units is configured to receive an input signal and a sample clock signal, and is configurable to operate in a selected one of a plurality of sampling modes;
    wherein the counter unit is configured to sample the input signal based on the selected sampling mode and a timing of the sample clock signal, and at a rate that is independent of the frequency of the input signal;
    wherein the timing of the sample clock signal represents a point in time when the counter unit receives an enabled sample clock signal.

21. The data acquisition device of claim 20, wherein the counter units are configured to take samples of the corresponding input signal to perform at least one of the following types of measurements: period, frequency, pulse-width, semi-period, time separation, or event counting.

* * * * *